(12) United States Patent
Wakabayashi et al.

(10) Patent No.: US 7,006,355 B2
(45) Date of Patent: Feb. 28, 2006

(54) COMBINATION STRUCTURE OF ELECTRONIC EQUIPMENT

(75) Inventors: Hiroyuki Wakabayashi, Kobe (JP); Takashi Ohta, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 4 days.

(21) Appl. No.: 10/310,772

(22) Filed: Dec. 6, 2002

(65) Prior Publication Data

US 2003/0086246 A1    May 8, 2003

Related U.S. Application Data

(62) Division of application No. 09/568,026, filed on May 10, 2000, now Pat. No. 6,560,115.

(30) Foreign Application Priority Data

May 14, 1999    (JP) ................................ 11-134418

(51) Int. Cl.
H05K 7/00    (2006.01)
(52) U.S. Cl. ...................... 361/728; 723/715; 723/729
(58) Field of Classification Search ........ 361/728–736, 361/744, 752, 715, 704, 707, 710, 723; 257/686, 257/691; 174/110 R, 110 E, 258
See application file for complete search history.

(56) References Cited

U.S. PATENT DOCUMENTS

| | | | |
|---|---|---|---|
| 4,218,724 A | 8/1980 | Kaufman | |
| 4,850,884 A | 7/1989 | Sawai et al. | |
| 5,023,752 A | 6/1991 | Detter et al. | |
| 5,408,383 A | * | 4/1995 | Nagasaka et al. ........... 361/707 |
| 5,478,244 A | 12/1995 | Maue et al. | |
| 5,519,252 A | * | 5/1996 | Soyano et al. ............... 257/690 |
| 5,591,034 A | 1/1997 | Ameen et al. | |
| 5,928,004 A | 7/1999 | Sumida et al. | |
| 5,980,302 A | 11/1999 | Saka | |
| 6,115,255 A | 9/2000 | Iovdalsky | |
| 6,201,696 B1 | 3/2001 | Shimizu et al. | |
| 6,421,244 B1 * | 7/2002 | Shinohara et al. .......... 361/736 |

FOREIGN PATENT DOCUMENTS

| | | |
|---|---|---|
| JP | 7-297561 | 11/1995 |
| JP | A 9-327112 | 12/1997 |
| JP | A 11-215657 | 8/1999 |

* cited by examiner

Primary Examiner—Kamand Cuneo
Assistant Examiner—Hung S. Bui
(74) Attorney, Agent, or Firm—Oliff & Berridge, PLC

(57) ABSTRACT

An electronic control unit 31 for mounting on a vehicle include a control portion 32 and a power portion 33 which are separate from each other, and are combined together. A control board 40 is mounted on a control connector-incorporating casing 34, having control connectors 35 and 36 formed integrally thereon, thereby forming the control portion 32. Connection terminals 41 on the control board 40 are soldered to connector connection terminals 37 and 38, embedded in the casing 34, and connection terminals 42 on the control board 40 are soldered to relay connection terminals 39 embedded in the casing 34. Power parts 57 and 58 are mounted on a power connector-incorporating casing 54, having power connectors 55 and 56 formed integrally thereon, and further a heatsink is mounted on the casing 54, thereby forming the power portion 33. An intermediate layer 51 can be provided between the control portion 32 and the power portion 33. Parts can be mounted on the intermediate layer 51.

2 Claims, 12 Drawing Sheets

FIG. 3
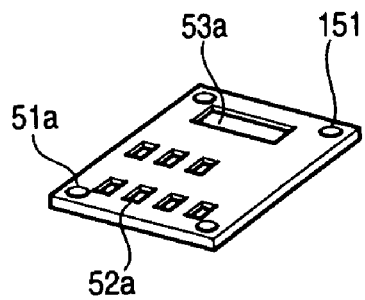
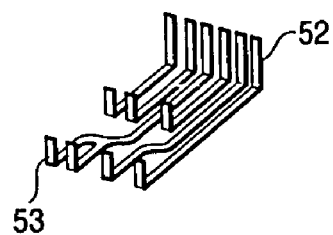
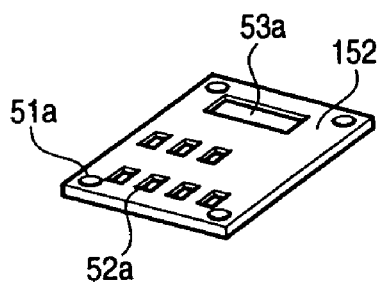
FIG. 4
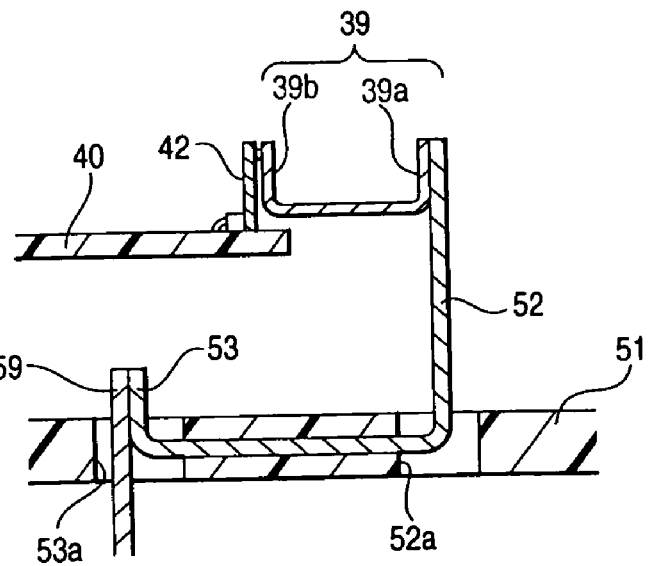

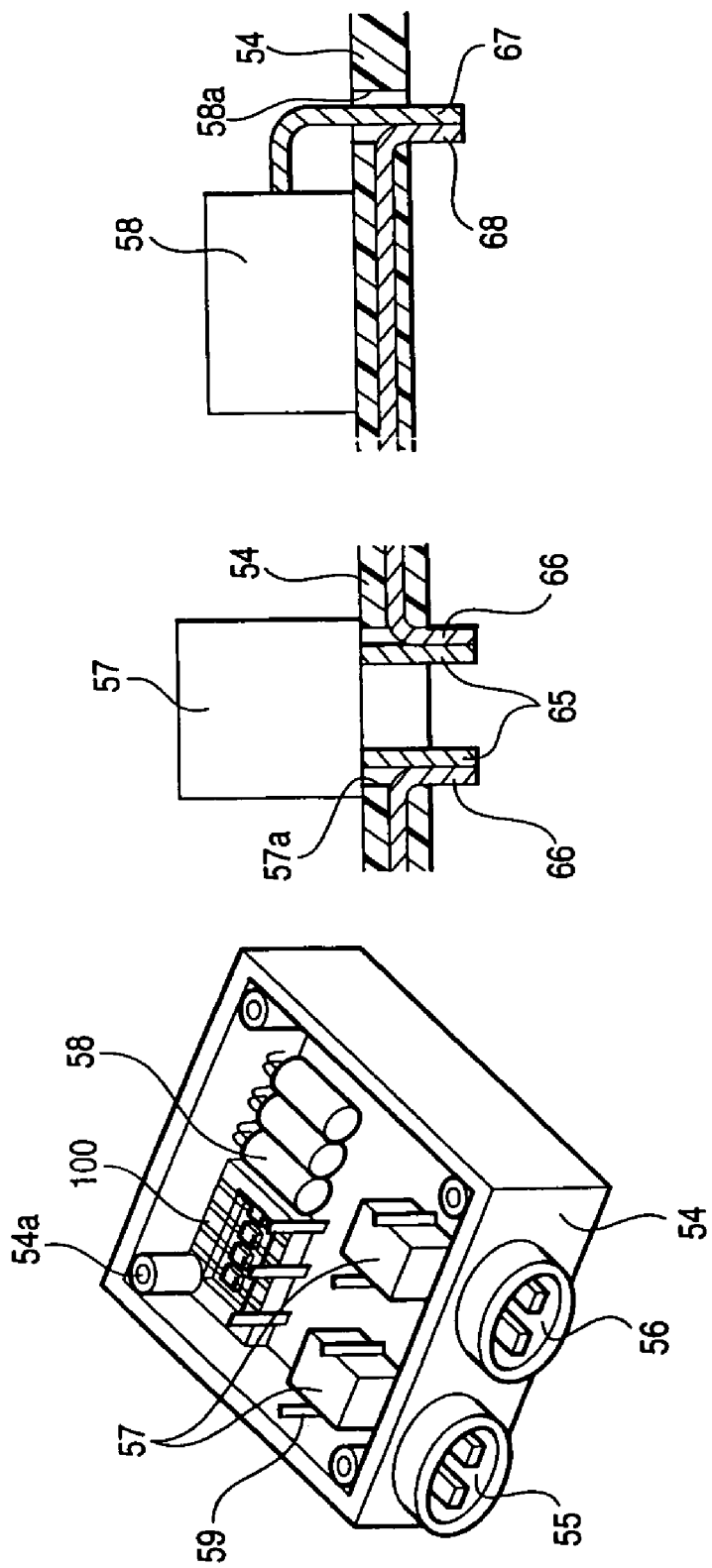

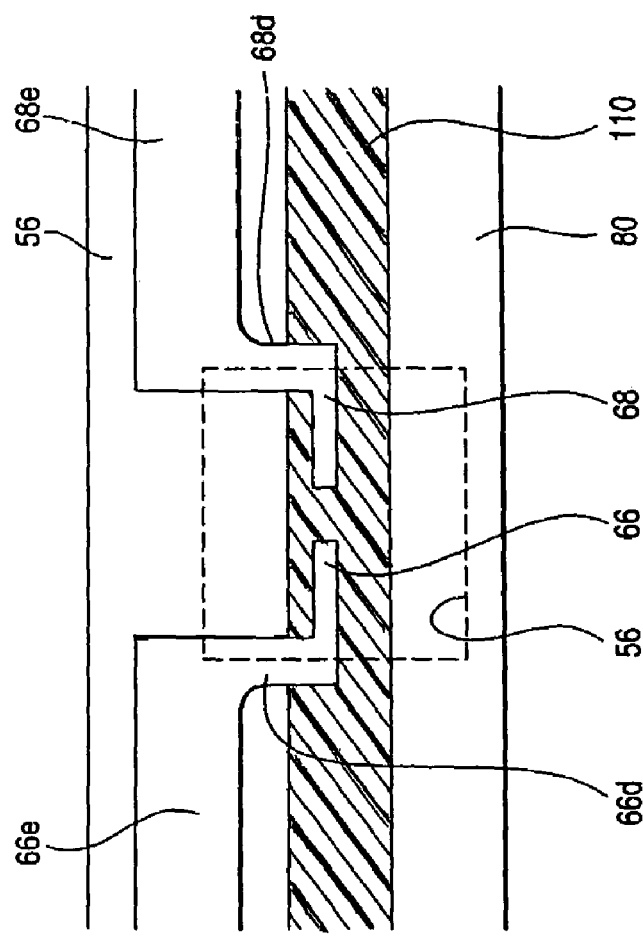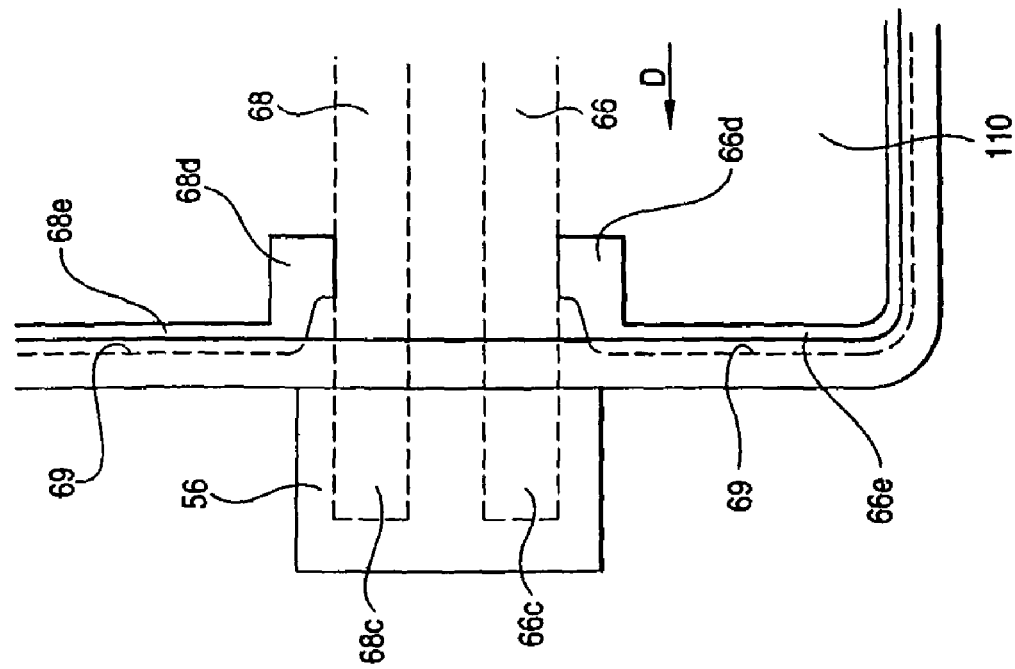

COMBINATION STRUCTURE OF ELECTRONIC EQUIPMENT

This is a Division of application Ser. No. 09/568,026 filed May 10, 2000 now U.S. Pat. No. 6,560,115.

BACKGROUND OF THE INVENTION

1. Field of the Invention

This invention relates to a combination structure of an electronic equipment including an electrical control circuit portion and a power circuit portion for providing electric power.

2. Description of the Related Art

Electronic control units (ECUs), each provided in a combined manner as a unit in accordance with the function of an object to be controlled, have heretofore been mounted on a vehicle. Each of the ECUs includes a control circuit portion (including a microcomputer or the like) for effecting a logical control operation, and a power circuit portion for controlling power to be fed to an exterior.

FIG. 15 roughly shows a combination structure of a conventional electronic control unit 1. Main portions of the electronic control unit 1 are contained in a connector-incorporating resin casing 2. A control connector 3 and power connectors 4 and 5 are provided in a gathered manner on one side surface of the connector-incorporating resin casing 2. With this construction, the connection to the electronic control unit 1 can be effected only from one direction. A plurality of power parts 6 and 7 are mounted within the connector-incorporating resin casing 2, and also connection terminals 8 and 9 are provided within the connector-incorporating resin casing 2. The connection terminals 8 and 9 are adapted to be electrically connected to a control board 10. The control board 10 is attached to the upper side of connector-incorporating resin casing 2, and has through holes 11 and 12 adapted to be electrically connected to the connection terminals 9 and the connection terminals 8, respectively. A plurality of control parts 13, 14 and 15 are mounted on the control board 10. A lid 20 is fitted on the casing 2 to cover the control board 10. A heatsink 21 is attached to the bottom of the connector-incorporating casing 2. A waterproof packing 22 is provided at a region of connection between the lid 20 and the connector-incorporating casing 2, and a waterproof packing 23 is provided at a region of connection between the connector-incorporating casing 2 and the heatsink 21.

In the combination structure shown in FIG. 15, the control board 10 is fixedly secured to the connector-incorporating casing 2 having the power parts 7 and 8 and so on mounted therein, and the control connector 3 and the power connectors 4 and 5 are formed integrally with the connector-incorporating casing 2. Therefore, the connector-incorporating casing 2 has a complicated construction, and can not be easily formed, and besides the assembling operation is difficult. JP-A-7-297561 discloses the conventional art concerning a box member of an electronic equipment in which a control circuit portion, a drive circuit portion and a power circuit portion are provided separately from one another in a manner to provide separate spaces. Radiating fins are mounted on the power circuit portion so as to prevent the temperature of the box member of the electronic equipment from rising. The circuit portions, which are different in signal level from one another, are separated from one another so as to reduce the rate of occurrence of malfunction due to noises. Signal input-output elements of the drive circuit portion are disposed near to signal input-output elements of the power circuit portion, and the two circuit portions are electrically connected directly to each other. However, the electrical connection between the drive circuit portion and the control circuit portion is made by a pair of connectors. Therefore, this structure can be regarded as being of the type in which the control circuit portion and the power circuit portion, including the drive circuit portion, are combined together.

In the combination structure shown in FIG. 15, the power connectors 4 and 5 and the control connector 3 are formed integrally with the connector-incorporating resin casing 2, and therefore the connector-incorporating resin casing 2 has a complicated construction, and can not be easily formed, and besides the assembling operation is difficult. Particularly when the connectors are increased in size and when the number of memories increases, it is difficult to provide the connectors on the same side surface of the connector-incorporating resin casing 2. The electronic control unit 1 is electrically connected to the exterior via wire harnesses, and when all of the connectors are not provided on the same side surface, the wire harnesses can not be easily arranged and installed, so that an installation space is increased. And besides, the packing 22 is used between the lid 20 and the casing 2, and also the packing 23 is used between the casing 2 and the heatsink 21, and this increases the production cost.

In the structure disclosed in JP-A-7-297561, the control circuit portion is connected to the drive circuit portion and the power circuit portion by the connectors, and therefore parts of these circuit portions need to be electrically connected to the connectors, and the amount of wires, used in each circuit portion, increases.

Conventionally, a large amount of heat is generated at bus bars which are near to connector pins of the connectors 4 and 5 attached to the power circuit portion of the electronic control unit 1 and which are connected to the connection terminals 8 and 9, in which a large electric current flows. The heat generated near to the connector pins or at the bus bar portion is radiated by the heatsink 21 fixed to the bottom surface of the connector-incorporating resin casing 2. The increase of the heatsink 21 in size can improve the heat radiation efficiency so that the control circuit portion is not adversely affected by heat. However, the increase of the heatsink 21 in size results in the increase of the total size of the electronic control unit 1, which makes the size reduction of the electronic control unit 1 difficult. Moreover, use of the large heatsink increases the manufacturing cost of the electronic control unit 1, which is inconvenient for the maker.

SUMMARY OF THE INVENTION

It is an object of this invention to provide a combination structure of an electronic equipment in which a control circuit portion and a power circuit portion are separated from each other so that the control circuit portion will be less affected by heat, generated by the power circuit portion, and will be less affected by noises, and besides an assembling operation can be effected easily.

According to the present invention, there is provided a combination structure of an electronic equipment wherein the electronic equipment comprises a control portion and a power portion which are separate from each other, and the control portion and the power portion are combined together;

wherein the control portion includes a control casing, and a plurality of control parts are provided within the control casing, and a plurality of control-side terminals, electrically connected to the respective control parts, are provided upright in a concentrated manner at a predetermined portion, and a hollow portion is provided within the control casing;

wherein the power portion includes a power casing, and a plurality of power parts are provided within the power casing, and a plurality of power-side terminals, electrically connected to the respective power parts, are provided upright in a concentrated manner at a predetermined portion; and wherein when the control portion and the power portion are combined together, the plurality of power-side terminals extend into the hollow portion of the control portion, and can contact the plurality of control-side terminals, respectively.

In the invention, the electronic equipment comprises the separate control and power portions which are combined together. The plurality of control parts are provided within the control casing of the control portion, and the plurality of control-side terminals, electrically connected to the respective control parts, are provided upright in a concentrated manner at the predetermined portion, and the hollow portion is provided within the control casing. The plurality of power parts are provided within the power casing of the power portion, and the plurality of power-side terminals, electrically connected to the respective power parts, are provided upright in a concentrated manner at the predetermined portion. When the control portion and the power portion are combined together, the plurality of power-side terminals extend into the hollow portion of the control portion, and can contact the plurality of control-side terminals, respectively. With this construction, merely by stacking the control portion and power portion together, the electrical connection can be effected. The control portion and the power portion are provided separately from each other, and therefore as compared with an integral construction, the control portion is less affected by heat from the power portion, and is less affected by noises, so that a stable operation can be effected.

In the invention, a control board is provided at the control portion, and a plurality of connection terminals, electrically connected to the plurality of control parts, are provided upright on the control board;

the control casing has a wall dividing an internal space of the control casing into a first hollow portion and a second hollow portion;

a plurality of relay connection terminals, forming the plurality of control-side terminals, are formed on the wall;

the plurality of power-side terminals can extend into the first hollow portion;

the control board can be received within the second hollow portion;

when the control board is received within the second hollow portion, the plurality of upright connection terminals can contact one ends of the plurality of relay connection terminals, respectively; and when the control portion is stacked on the power portion, the plurality of power-side terminals extend into the first hollow portion, and can contact the other ends of the relay connection terminals, respectively.

In the invention, the internal space of the control casing is divided into the first hollow portion and the second hollow portion by the wall. The control board, on which the plurality of connection terminals, electrically connected to the plurality of control parts, are provided upright, is received within the second hollow portion. When the control board is received within the second hollow portion, the plurality of connection terminals, provided upright on the control board, contact one ends of the plurality of relay connection terminals, respectively. When the control portion is stacked on the power portion, the plurality of power-side terminals extend into the first hollow portion, and contact the other ends of the relay connection terminals, respectively. The control board and the power portion can be connected together through the relay connection terminals, and therefore even if the connection terminals are randomly provided upright in accordance with the arrangement of the control parts on the control board, the connection terminals can be connected to the relay connection terminals in a concentrated manner, and the control portion-side terminals are disposed very close to the respective power portion-side terminals, and the electrical connection therebetween can be easily effected when the control portion and the power portion are combined together.

In the invention, a plurality of connection terminals, electrically connected to the plurality of power parts, are provided upright at the power portion;

there is provided an intermediate layer for mounting on the power portion, and a plurality of power portion connection terminals are provided upright on the intermediate layer, and correspond in position to the plurality of connection terminals within the power portion, and insertion holes are formed through the intermediate layer, and are disposed adjacent to the power portion connection terminals, respectively, and the plurality of power-side terminals, electrically connected respectively to the plurality of power portion connection terminals, are formed upright in a concentrated manner on a predetermined portion of the intermediate layer; and when the intermediate layer is mounted on the power portion, the plurality of connection terminals extend respectively through the insertion holes, and can contact the plurality of power portion connection terminals, respectively.

In the invention, the plurality of connection terminals, electrically connected to the plurality of power parts, are provided upright at the power portion, and the plurality of power portion connection terminals are provided upright on the intermediate layer, and correspond in position to the plurality of connection terminals within the power portion, and the insertion holes are formed through the intermediate layer, and are disposed adjacent to the power portion connection terminals, respectively, and the plurality of power-side terminals, electrically connected respectively to the plurality of power portion connection terminals, are formed upright in a concentrated manner on the predetermined portion of the intermediate layer. The plurality of connection terminals of the power portion extend respectively through the insertion holes in the intermediate layer, and contact the plurality of power portion connection terminals, respectively. Even if the connection terminals are randomly provided upright in accordance with the arrangement of the power parts within the power casing, these connection terminals can be contacted with the respective power portion connection terminals on the intermediate layer, and can be connected to the power-side terminals in a concentrated manner in the intermediate layer. The control portion-side terminals are disposed very close to the power portion-side terminals, and the electrical connection therebetween can be easily effected when the control portion and the power portion are combined together.

In the invention, insertion holes are formed in the power casing of the power portion, and each terminal of each of the power parts can project through the corresponding insertion hole in a direction away from that side of the power casing to be combined with the control portion, and the power casing has bus bars each exposed to the corresponding insertion hole and projecting in the direction away from the combination side of the power casing; and when each of the power parts is mounted on the power casing, each terminal of the power part projects through the corresponding insertion hole in the direction away from the combination side of the power casing, and can contact the corresponding bus bar.

In the invention, the terminals of the power parts are contacted with the respective bus bars at the power portion, and the control portion is combined with that side of the power portion facing away from this connection portion, and the power portion and the control portion are joined together. Therefore, the joining of the terminals of the power parts to the respective bus bars and the electrical connection between the control portion and the power portion can be easily effected separately from each other.

In the invention, the connection between the plurality of power-side terminals and the plurality of control-side terminals, the connection between the plurality of connection terminals, provided upright on the control board, and one ends of the plurality of relay connection terminals, the connection between the plurality of power-side terminals and the other ends of the plurality of relay connection terminals, the connection between the plurality of connection terminals, provided upright at the power portion, and the plurality of power portion connection terminals, and the connection between the terminals of the power parts and the bus bars are effected by resistance welding.

In the invention, the plurality of power-side terminals can be disposed to contact the plurality of control-side terminals, and the plurality of connection terminals, provided upright on the control board, can be disposed to contact one ends of the plurality of relay connection terminals, and the plurality of power-side terminals can be disposed to contact the other ends of the plurality of relay connection terminals, and the plurality of connection terminals, provided upright at the power portion, can be disposed to contact the plurality of power portion connection terminals, and the terminals of the power parts can be disposed to contact the bus bars. Therefore, these mating portions, while held in contact with each other, are joined together by resistance welding, and therefore the positive electrical connection can be effected easily.

In the invention, welding portions which can be joined together by ultrasonic welding, or welding portions, which can be jointed together by vibration welding, are formed respectively at those portions of the power portion and the control portion which are to be combined together.

In the invention, the welding portions which can be joined together by ultrasonic welding, or the welding portions, which can be jointed together by vibration welding, are formed respectively at those portions of the power portion and the control portion which are to be combined together. Therefore, the waterproof effect and the joining can both be effected without the use of a packing or the like.

In the invention, after the control board is received in the second hollow portion of the control portion, a resin layer is formed by resin potting in such a manner that the control board is sealed in the resin layer.

In the invention, the control board is received in the second hollow portion of the control casing, and then the resin layer is formed by resin potting in such a manner that the control board is sealed in the resin layer. Therefore, the electrical connection portions in the control board are prevented from being exposed, thereby enhancing the reliability.

In the invention, parts are mounted on the intermediate layer.

In the invention, the parts are also mounted on the intermediate layer, and therefore for example, the power parts are mounted on the intermediate layer so that the degree of freedom of arrangement of the parts in the power portion can be increased. For example, when a drive circuit for driving a power control element at the power portion in response to a signal from the control portion is provided on the intermediate layer, signals in the electronic equipment flow generally from the control portion to the power portion, so that the reliability can be enhanced.

In the invention, a heatsink for radiating heat from the power portion is mounted on the power portion;

a recess for receiving the terminals of the power parts and the bus bars is formed in the heatsink; and a resin is filled in the recess by resin potting, so that the terminals of the power parts and the bus bars are sealed in the resin.

In the invention, the recess for receiving the terminals of the power parts and the bus bars is formed in the heatsink mounted on the power portion so as to radiate heat from the power portion, and the resin is filled in the recess by resin potting, so that the terminals of the power parts and the bus bars are sealed in the resin. Therefore, the reliability of the connection portions is enhanced, and besides heat can be efficiently radiated from the power portion, thereby reducing adverse effects of the heat on the electronic equipment.

In the invention, a heatsink is disposed under the power portion for radiating heat from the power portion, in which the heatsink defines a recess filled with the resinl. In the heat sink, at least one of the plurality of bus bars elongates above the recess and are inserted into the recess.

In the invention, the at least one of the plurality of bus bars may comprises a first bus bar elongating above the recess, and a second bus bar inserted into the recess, the second bus bar connected to the first bus bar.

In the invention, the at least one of the plurality of bus bars may be inserted into the recess and fold back upwardly.

In the invention, a part of at least one of the plurality of bus bars is disposed along with an inner side surface of the power casing.

In the invention, the plurality of bus bars are embedded in a synthetic resin layer in the power casing, and a part of at least one of the plurality of bus bars is exposed out of the synthetic resin layer.

BRIEF DESCRIPTION OF THE DRAWINGS

FIG. 3 is an exploded, perspective view showing the manner of assembling a modified intermediate layer 51 (FIG. 1) of the type in which power-side terminals 52 and power portion connection terminals 53 are held between a pair of upper and lower insulating members 151 and 152.

FIG. 4 is a fragmentary, cross-sectional view roughly showing an electrical connection between a control portion 32 and the intermediate layer 51.

FIGS. 5A to 5C are a perspective view, a fragmentary view and a cross-sectional view, showing a condition of mounting of power parts 57 and 58 in the power connector-incorporating casing 54 of a power portion 33, as well as the electrical connection of these power parts.

FIGS. 10A and 10B show an embodiment of the invention, in which FIG. 10A is a top view showing a portion near a connector pin of the power connector-incorporating casing 54, and FIG. 10B is a view of the power connector-incorporating casing 54 seen from a lateral side.

FIGS. 11A and 11B show an embodiment of the invention, in which FIG. 11A is a top view showing a portion near the connector pin of the power connector-incorporating casing 54, and FIG. 11B is a view of the power connector-incorporating casing 54 seen from a lateral side.

FIGS. 12A and 12B show an embodiment of the invention, in which FIG. 12A is a top view showing a portion of the power connector-incorporating casing 54 in which an recess 80a is formed in the heatsink 80.

FIGS. 13A and 13B show an embodiment of the invention, in which FIG. 13A is a top view showing a portion near a connector 56, and FIG. 13B is a view near the connector 56 seen from a direction indicated by an arrow D in FIG. 13A.

FIGS. 14A and 14B show an embodiment of the invention, in which FIG. 14A is a top view of a part of a bus bar 66 provided in the power connector-incorporating casing 54, and FIG. 14B is a view seen from a direction indicated by an arrow E in FIG. 14A.

DETAILED DESCRIPTION OF THE PRESENT INVENTION

The present invention will be described in detail with reference to the accompanying drawings.

Figure 1:
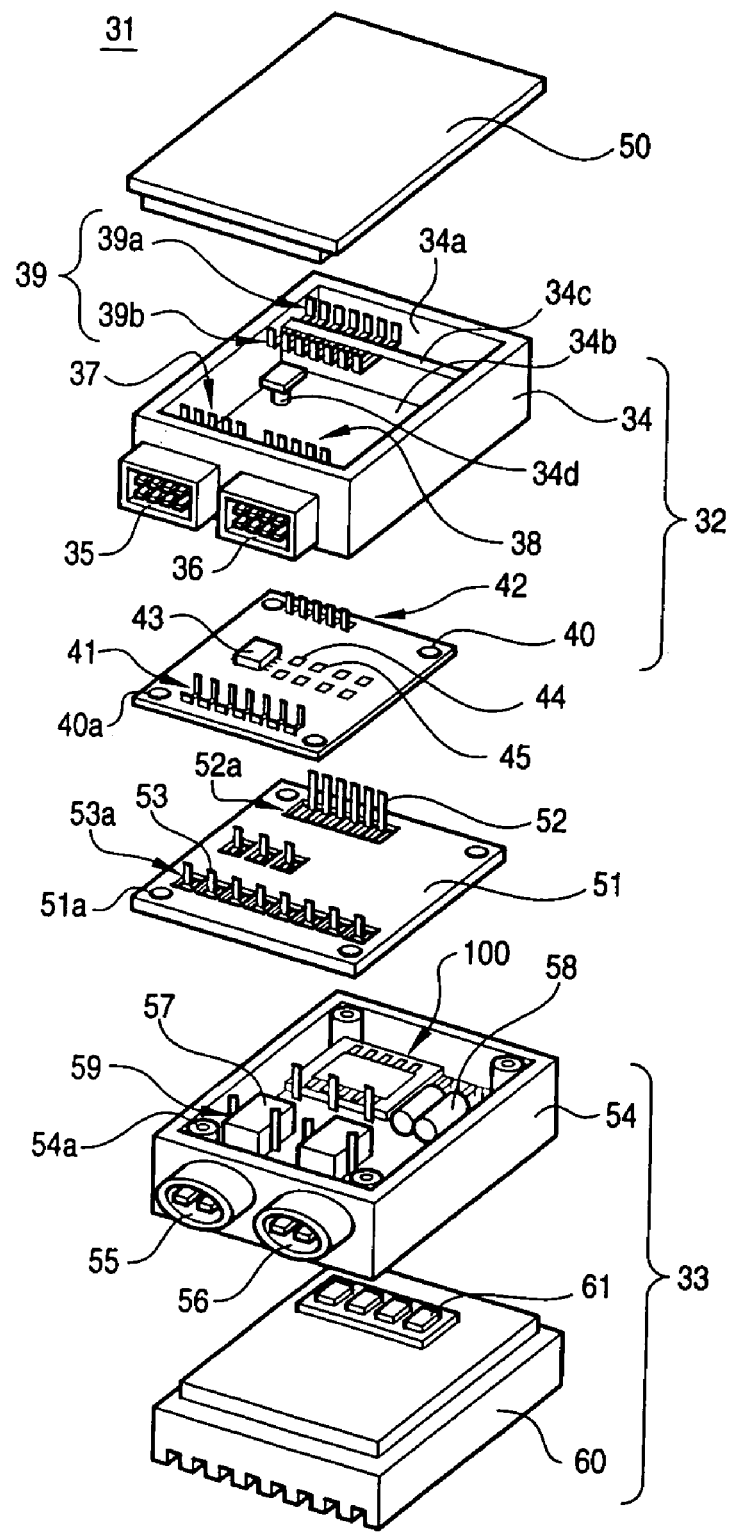
FIG. 1 is an exploded, perspective view roughly showing one preferred embodiment of a combination structure of an electronic control unit 31 of the invention.

FIG. 1 roughly shows a combination structure of an electronic control unit 31 for mounting on a car, which is one preferred embodiment of an electronic equipment of the invention. The electronic control unit 31 is structurally divided into a control portion 32 and a power portion 33, and has such a structure that mounting of parts is easy, and that the two portions can be easily combined together. The control portion 32 comprises a control connector-incorporating casing (control casing) 34 which serves as a base portion for this control portion 32. The control connector-incorporating casing 34 is integrally molded of a synthetic resin, and has electrically-conductive metal portions partially embedded in a molded body thereof. An internal space of the control connector-incorporating casing 34 is divided into a first hollow portion 34a and a second hollow portion 34b by a wall 34c. The control connector-incorporating casing 34 has a generally rectangular parallelepiped shape, and control connectors 35 and 36 are formed integrally on one side surface of this casing 34. Spacers 34d are provided respectively at corner portions of the second hollow portion 34b, and are disposed at the bottom of the control connector-incorporating casing 34. Wire harnesses for the electronic control unit 31 for mounting on a car can be connected to the control connectors 35 and 36, respectively. The metal conductor portions, embedded in the body of the control connector-incorporating casing 34 form connector connection terminals 37 and 38, relay connection terminals 39, metal terminal portions within the control connector 35 and metal terminal portions within the control connector 36. More specifically, the metal terminal portions within the control connector 35 are connected respectively to the connector connection terminals 37 while the metal terminal portions within the control connector 36 are connected respectively to the connector connection terminals 38. The connector connection terminals 37 and 38 are embedded in the electrically-insulative resin, forming the control connector-incorporating casing 34, and extend into the second hollow portion 34b. The relay connection terminals 39 are formed on the wall 34c, and opposite ends 39a and 39b of each relay connection terminal 39 are disposed in the first and second hollow portions 34a and 34b, respectively.

Main portions of a control circuit portion of the control portion 32 are formed on a control board 40. Such as an ordinary printed circuit board, the control board 40 is formed by forming an electrically-conductive foil (e.g. a copper foil) on one or each side of a board made of an electrically-conductive synthetic resin, or by further forming one or more intermediate layers (electrically-conductive foils) in this synthetic resin board. The control board 40 is inserted into the second hollow portion 34b from the lower side of the control connector-incorporating casing 34, and the spacers 34d are fitted respectively in mounting holes 40a, formed respectively through corner portions of the control board 40, and the control board 40 is secured to the casing 34 by screws or by thermal deformation. Electrical connection terminals 41, corresponding in position respectively to the connector connection terminals 37 and 38, as well as electrical connection terminals 42 corresponding in position respectively to one ends 39b of the relay connection terminals 39, are formed on the control board 40. When the control board 40 is fitted into a predetermined position in the second hollow portion 34b of the control connector-incorporating casing 34, the connection terminals 41 are disposed for electrical contact with the connector connection terminals 37 and 38, respectively, while the connection terminals 42 are disposed for electrical contact with the one ends 39b of the relay connection terminals 39, respectively. The connection terminals 41 and 42 are mounted on the control board 40 by a surface mounting technique such as reflow soldering. Control parts 43, 44 and 45 are mounted on an obverse surface or a reverse surface of the control board 40. The control parts 43, 44 and 45 are various electronic parts such for example as a semiconductor integrated circuit, a resistor and a capacitor, and are mounted on the control board 40, using the surface mounting technique. A wiring pattern is formed on the control board 40, and this wiring pattern makes an electrical connection between the control parts 43, 44 and 45 and the connection terminals 41 and 42, and also forms the control circuit portion. The control board 40 is received within the control connector-incorporating casing 34, and the electrical connections and so on are effected, and then a lid 50 is put on the upper side of the casing 34, and the interior of the control unit 31 is sealed in a waterproof manner. The lid 50 is secured to the casing 34 by ultrasonic welding or vibration welding. The lid 50 is joined directly to the control connector-incorporating casing 34 by ultrasonic waves (in case of the ultrasonic welding) or by vibrations (in case of the vibration welding). By thus joining the lid 50 by ultrasonic waves or vibrations, a waterproof effect can be obtained without use of a packing or the like, and therefore the cost can be reduced.

The power portion 33 is connected to the lower side of the control portion 32 via an intermediate layer 51 interposed therebetween. The intermediate layer 51 has power-side terminals 52 and power portion connection terminals 53, and these terminals 52 and 53 are embedded in a plate made of an electrically-insulative synthetic resin. As described later, the intermediate layer 51 can be of a type in which power-side terminals 52 and power portion connection terminals 53 are held between electrically-insulative plates. When the intermediate layer 51 is inserted into a predetermined position within the second hollow portion 34*b* of the control connector-incorporating casing 34 from the lower side thereof, the power-side terminals 52 are disposed at a lower portion of the control connector-incorporating casing 34. When the intermediate layer 51 is mounted at a lower portion of the control connector-incorporating casing 34, the power-side terminals 52 are disposed in the first hollow portion 34*a* of the control connector-incorporating casing 34 so as to be held in electrical contact with the other ends 39*a* of the relay connection terminals 39, respectively. When the intermediate layer 51 and the power portion 33 are combined together, the power portion connection terminals 53 are electrically connected to the power portion 33. Mounting holes 51*a* are formed through corner portions of the intermediate layer 51, respectively, and the spacers 34*d* are fitted respectively in these mounting holes 51*a* so as to mount the intermediate layer 51 on a power connector-incorporating casing 54. The power-side terminals 52 extend upwardly respectively from insertion holes 52*a* formed through the intermediate layer 51, and the power portion connection terminals 53 extend upwardly respectively from insertion holes 53*a* formed through the intermediate layer 51.

The power portion 33 comprises the power connector-incorporating casing (power casing) 54 which serves as a base portion for this power portion 33. The power connector-incorporating casing 54 has metal conductor parts embedded in its body made of an electrically-insulative synthetic resin. The power connector-incorporating casing 54 has a generally rectangular parallelepiped shape, and is of such a configuration that the control connector-incorporating casing 34 can be stacked on the power connector-incorporating casing 54. Power connectors 55 and 56 are formed on one side surface of the power connector-incorporating casing 54 which faces in the same direction as the direction of facing of that side surface of the control connector-incorporating casing 34, having the control connectors 35 and 36 formed thereon, in a stacked condition of the two casings 34 and 54. Parts (or portions) of bus bars, embedded in the power connector-incorporating casing 54, are exposed to form metal terminal portions provided within the power connectors 55 and 56. Power parts 57 and 58 are mounted within the power connector-incorporating casing 54, and connection terminals 59 for electrical connection to the respective power portion connection terminals 53 on the intermediate layer 51 are provided in an upstanding manner within the casing 54. The connection terminals 59 are also formed by bending parts (or portions) of the bus bars embedded in the power connector-incorporating casing 54. Spacer portions 54*a* for the purpose of mounting the intermediate layer 51 are formed at an upper portion of the power connector-incorporating casing 54, and are so disposed as to be aligned respectively with the mounting holes 51*a* in the intermediate layer 51. When the control connector-incorporating casing 34 and the power connector-incorporating casing 54 are combined together, the spacers 34*d* are fitted relative to the spacer portions 54*a*, respectively. For achieving this fitting connection, for example, a projection is formed on each spacer 34*d* while a hole for receiving this projection is formed in each spacer portion 54*a*. A hole can be formed in each spacer 34*d* while a projection can be formed on each spacer portion 54*a*. The connection can be made using screw holes or heli-sert tap.

A heatsink 60 is mounted on that side of the power connector-incorporating casing 54 facing away from that side thereof to which the control connector-incorporating casing 34 is connected through the intermediate layer 51. The heatsink 60 is made of metal having good thermal conductivity, and fins are formed on a reverse surface thereof, and semiconductor power modules 61 for controlling power are mounted on an obverse surface thereof. Parts (portions) of bus bars in the power connector-incorporating casing 54, are exposed in a flat manner at that side of the casing 54 opposed to the heatsink 60, and when the heatsink 60 is mounted on the lower side of the power connector-incorporating casing 54, an electrical connection between the casing 54 and the power modules 61 is made through these exposed bus bars. The power connector-incorporating casing 54 and the heatsink 60 are bonded together by a resin adhesive.

Figure 2A:
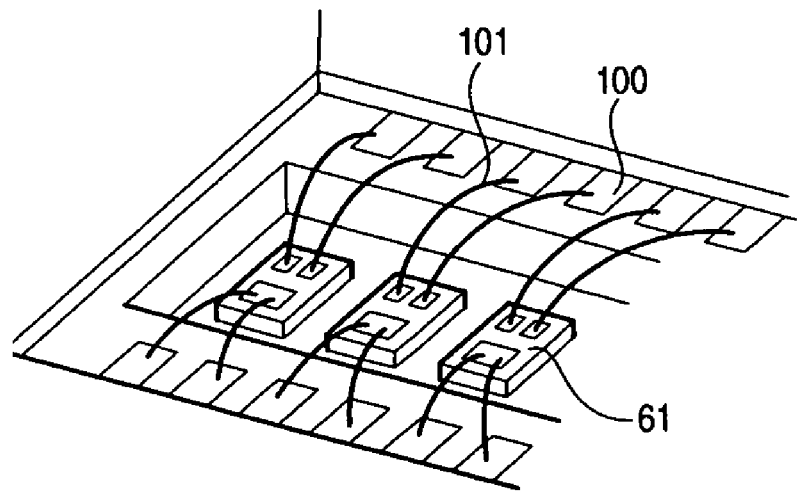
FIGS. 2A and 2B are a perspective view and a cross-sectional view, respectively, showing a condition of electrical connection between electrical connection portions 100, provided on a power connector-incorporating casing 54 of FIG. 1, and power modules 61.
Figure 2B:
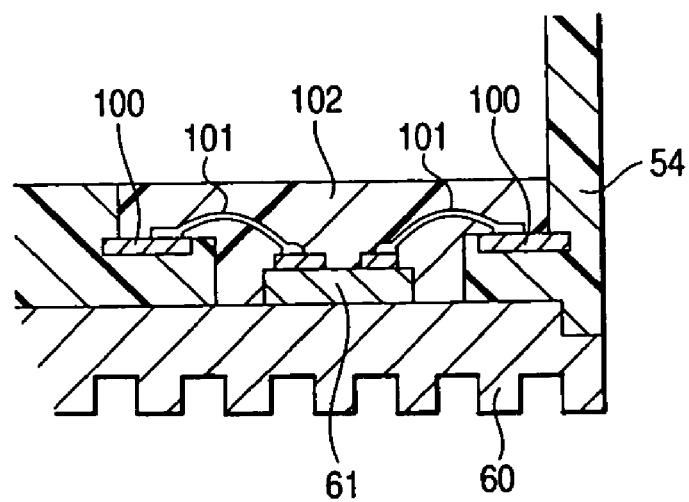

FIG. 2 shows a condition of electrical connection between electrical connection portions 100, provided on the power connector-incorporating casing 54, and the power modules 61. FIG. 2A is a perspective view, and FIG. 2B is a cross-sectional view. The electrical connection portions 100, defined respectively by the exposed portions of the bus bars, and the power modules, each comprising a semiconductor device, are connected together (that is, wire-bonded) by bonding wires 101 made of aluminum, gold or copper. Then, a resin is filled, and is solidified or cured to form a resin layer 102, thereby sealing the power modules 61 and the electrical connection portions 100.

FIG. 3 shows the manner of assembling the intermediate layer 51 (FIG. 1) of the type in which the power-side terminals 52 and the power portion connection terminals 53 are held between a pair of upper and lower insulating members 151 and 152. The power-side terminals 52 and the power portion connection terminals 53 are interconnected by metal conductors, and therefore are electrically connected together. Insertion holes 52*a* and 53*a* are formed through each of the upper and lower insulative members 151 and 152, and the power-side terminals 52 and the power portion connection terminals 53, when held between the two insulative members, are exposed.

The intermediate layer 51, shown in FIG. 1 and FIG. 3, is provided in order to concentrate the upstanding terminals provided randomly at the power side. Therefore, the intermediate layer 51 can be regarded as forming part of the power side, and when the control portion 32 and the power portion 33 are combined together, the power-side terminals 52 function as connection terminals for the control portion 32. The relay connection terminals 39, shown in FIG. 1, can concentrate upstanding terminals provided randomly at the control portion 32, and when the control portion 32 is combined with the power portion 33, the relay connection terminals 39 function as control-side terminals. Therefore, when the control portion 32 and the power portion 33 are combined together, the other ends 39*a* of the relay connection terminals 39, serving as the control-side terminals, are disposed in proximity to the power-side terminals 52, respectively, so that each of the other ends 39a can be easily welded to the associated power-side terminal 52.

For assembling the electronic control unit 31 of FIG. 1, first, the connection terminals 41 and 42 and the control parts 43, 44 and 45 are mounted on the control board 40, and the power parts 57 and 58 are mounted on the power connector-incorporating casing 54 in such a manner that these power parts 57 and 58 are connected by resistance welding to the connection terminals 59 defined respectively by the end portions of the bus bars, and the power modules 61 are mounted on the heatsink 60. The control board 40 is combined with the control connector-incorporating casing 34, and the connector connection terminals 37 and 38 are electrically connected respectively to the connection terminals 41 by resistance welding, and also the one ends 39b of the relay connection terminals 39 are electrically connected respectively to the connection terminals 42 by resistance welding, thereby forming the control portion 32. The power connector-incorporating casing 54 and the heatsink 60 are bonded together by a resin adhesive, and the electrical connection portions 100 of the bus bars are electrically connected (that is, wire-bonded) to the power modules 61 by the bonding wires made of aluminum, copper or gold, and a resin in a liquid state for forming the resin layer 102 is filled, and is solidified to seal the electrical connection portions 100 and the power modules 61, thereby forming the power portion 33.

The intermediate layer 51 is so shaped as to be fitted in the upper portion of the power connector-incorporating casing 54. The spacer portions 54a, formed at the upper portion of the power connector-incorporating casing 54, are fitted respectively in the mounting holes 51a in the intermediate layer 51, and the intermediate layer 51 is fixedly secured to the casing 54 by screws or by thermal deformation. As a result, the power portion connection terminals 53 are so close to the connection terminals 59 as to contact them, respectively, so that the terminals 53 can be electrically connected to the terminals 59, respectively, and therefore the terminals 53 are electrically connected respectively to the terminals 59 by resistance welding. Thus, the intermediate layer 51 is mounted on the power portion 33, and in this condition the control portion 32 is combined with this power portion 33 from the upper side. The control connector-incorporating casing 34 and the power connector-incorporating casing 54 are joined together by ultrasonic welding or vibration welding. By thus effecting the joining by the use of ultrasonic waves or vibration, a good waterproof effect is obtained, and therefore there is no need to provide a packing or the like between the two casings, and therefore the production cost can be reduced.

When the control portion 32 and the power portion 33 are combined together, the control portion connection terminals 52 of the intermediate layer 51 project into the first hollow portion 34a so as to be contacted respectively with the other ends 39a of the relay connection terminals 39 in the control connector-incorporating casing 34, respectively, and can contact these ends 39a, respectively, and therefore terminals 52 are electrically connected or joined respectively to the ends 39a by resistance welding.

In the condition in which the power portion 33 and the control portion 32 are thus combined together, the upper side of the control connector-incorporating casing 34 is open, and resin potting can be applied from this open side so as to enhance the reliability of the control portion 32. Further, the lid 50 is put on the casing 34 to cover the upper side thereof, and can be welded thereto by ultrasonic waves or vibration in a sealed manner.

FIG. 4 shows the intermediate layer 51 of FIG. 1, and more specifically shows the condition of connection between the power-side terminal 52 and the other end 39a of the relay connection terminal (control-side terminal of the control connector-incorporating casing 34) 39, as well as the condition of connection between the power portion connection terminal 53 and the connection terminal 59 of the power connector-incorporating casing 54. The power-side terminal 52 and the power portion connection terminal 53, provided at the intermediate layer 51, are interconnected and hence electrically connected together by the metal conductor embedded in the synthetic resin layer, and the opposite end portions of the metal conductor are bent and exposed to the surface of the intermediate layer 51. Namely, the bent end portions, exposed to the surface, serve as the power-side connection terminal 52 and the power portion connection terminal 53, respectively, and can be electrically connected respectively to the other end 39a of the relay connection terminal 39 and the connection terminal 59, and can be joined respectively to the other end 39a and the connection terminal 59 by resistance welding.

FIG. 5 shows a condition of mounting of the power parts 57 and 58 in the power connector-incorporating casing 54. As shown in FIG. 5A, the power parts 57, such as a relay, and the power parts 58, such as an electrolytic capacitor, are mounted within the power connector-incorporating casing 54. Insertion holes 57a for respectively passing terminals of the power parts 57 therethrough, as well as insertion holes 58a for respectively passing terminals of the power parts 58 therethrough, are formed in the power connector-incorporating casing 54. As shown in FIG. 5B, the power part 57, such as a relay, is placed on a board of the power connector-incorporating casing 54 from the upper side, and the terminals 65 of this power part 57 are electrically joined by resistance welding to respective ends of bus bars, embedded in the power connector-incorporating casing 54, in the insertion holes 57a disposed beneath the power part 57 As shown in FIG. 5C, the terminal 67 of the electrolytic capacitor is bent and inserted into the insertion hole 58a, and is joined to an end of a bus bar 68 by resistance welding.

Figure 6A:
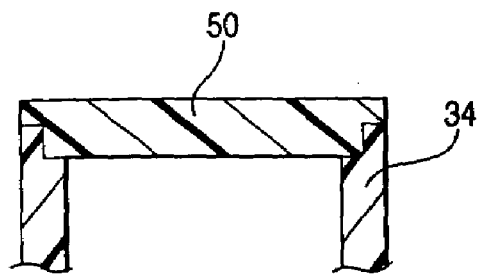
FIGS. 6A and 6B are fragmentary, cross-sectional views, respectively showing the joint between a lid 50 and a control connector-incorporating casing 34 and the joint between the control connector-incorporating casing 34 and the power connector-incorporating casing 54 in the embodiment of FIG. 1.
Figure 6B:
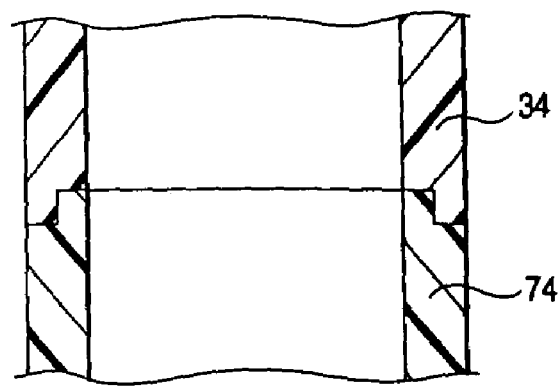

FIG. 6A shows the joint between lid 50 and the control connector-incorporating casing 34, and FIG. 6B shows the joint between the control connector-incorporating casing 34 and the power connector-incorporating casing 54. The joining of the lid 50 to the casing 34, as well as the joining of the casing 34 to the casing 54, is effected by ultrasonic welding or vibration welding. With this ultrasonic welding or vibration welding, the waterproof joining can be achieved without the use of a packing, and the assembling cost can be reduced.

Figure 7:
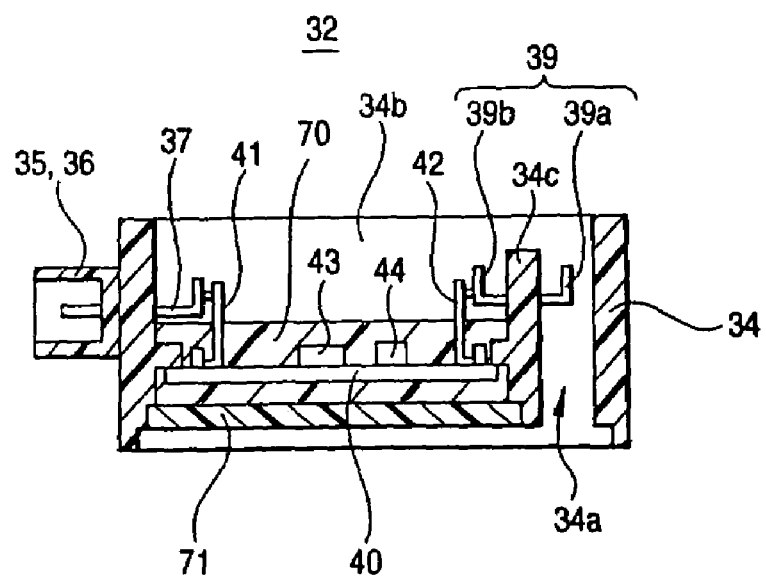
FIG. 7 is a cross-sectional view roughly showing a condition in which resin potting is applied to the control portion 32.

FIG. 7 shows a condition in which a resin layer 70 is formed by resin potting in the control portion 32. In the resin potting, the control board 40 is received in the second hollow portion 34b, and then a lid 71 is attached to the reverse side of the second hollow portion 34b, and in this condition silicone or an epoxy resin in a molten state is applied, thereby effecting the resin potting. The lid 71 is used as a bottom portion for the resin potting in the control connector-incorporating casing 34. The potting resin is solidified to form the resin layer 70, thereby enhancing the reliability of the control board 40.

Figure 8:
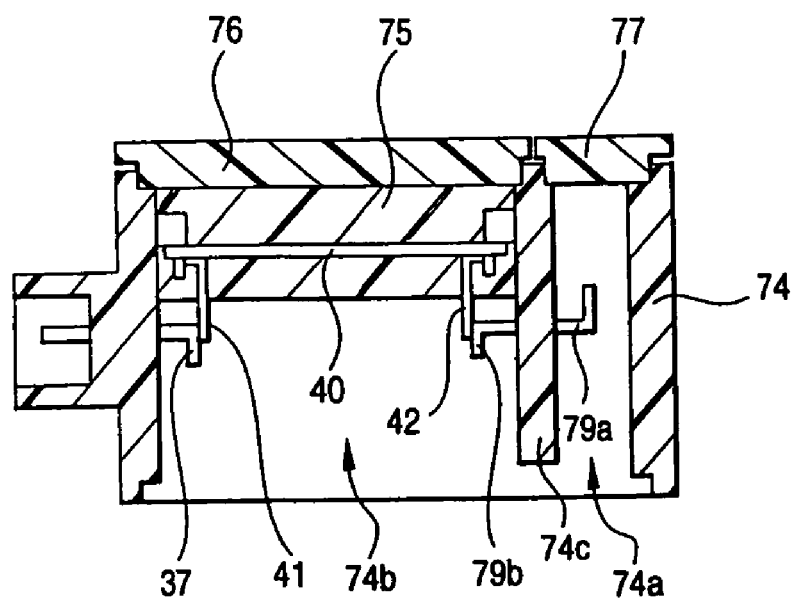
FIG. 8 is cross-sectional view of another embodiment, roughly showing a condition in which a resin layer 75 is formed on a control connector-incorporating casing by resin potting.

FIG. 8 shows another embodiment of the invention using modified resin potting. In this embodiment, an internal space of a control connector-incorporating casing 74 is divided into a first hollow portion 74a and a second hollow portion 74b by a wall 74c. When forming a resin layer 75 by resin potting, a lid 76 can be used as means for receiving a molten resin. In the resin potting, a control board 40 is inserted into the second hollow portion 74b from the upper side of the control connector-incorporating casing 74, and the lid 76 is put on the casing 74, and then the casing 74 is inverted, so that the lid 76 is disposed at the lower side, and then the molten resin is poured into the second hollow portion 74 to effect the resin potting. After the resin is solidified to form the resin layer 75, the power-side terminals 52 on the intermediate layer 51 are electrically joined respectively to one ends 79a of relay connection terminals 79. Then, a lid 77 is attached to the casing 74, thus completing the assembling of the electronic control unit. The lid 77 is used so as to enable the connection of the other ends 79a of the relay connection terminals 79, and after this connection is effected by resistance welding, the lid 77 is joined to the casing 74 by ultrasonic welding or vibration welding.

Figure 9:
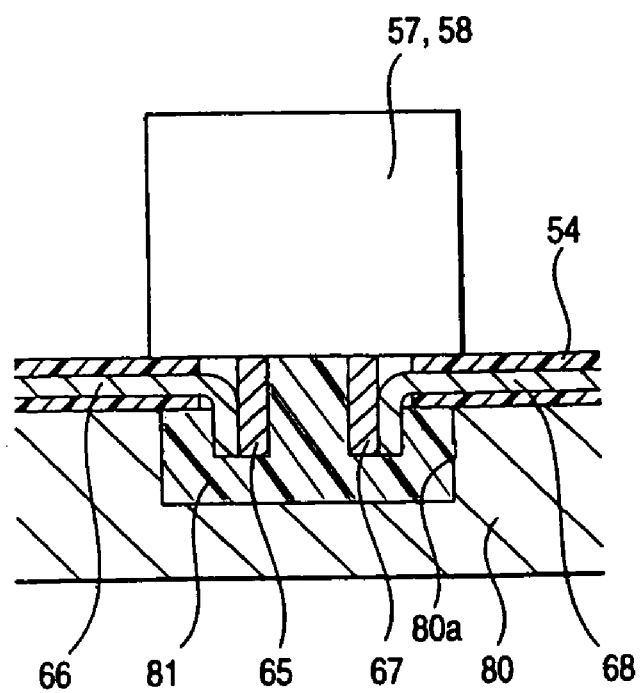
FIG. 9 is a fragmentary, cross-sectional view of a further embodiment, showing a construction in which heat is radiated from the power part 57, 58 by a heatsink 80.

FIG. 9 shows a further embodiment of the invention in which power parts 57 and 58, mounted on the power connector-incorporating casing 54, are connected to a heatsink 80. A recess 80a is formed in the heatsink 80 so that electrically-joined portions of a terminal 65 and a bus bar 66 will not be short-circuited to electrically-joined portions of a terminal 67 and a bus bar 68. In order to enhance the thermal transfer between the power parts 57 and 58 and the heatsink 80, an electrically-insulative resin is potted to form a resin layer 81.

It is preferable for the electrically-insulative resin for the resin layer 81 to use an electrically-insulative resin having high thermal conductivity and excellent heat radiation efficiency, for which an epoxy resin, a silicone resin, etc. may be used. In the present invention, the electrically-insulative resin having high thermal conductivity is used as a filling resin so that heat generated in the bus bar can be conducted quickly to the heatsink 80, and the heat radiation efficiency can be improved.

Figure 10A:
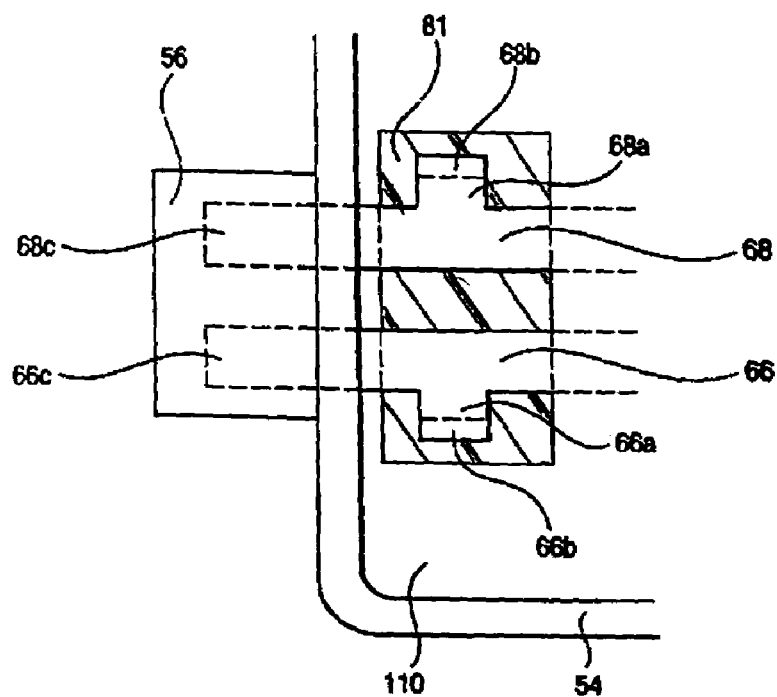
Figure 10B:
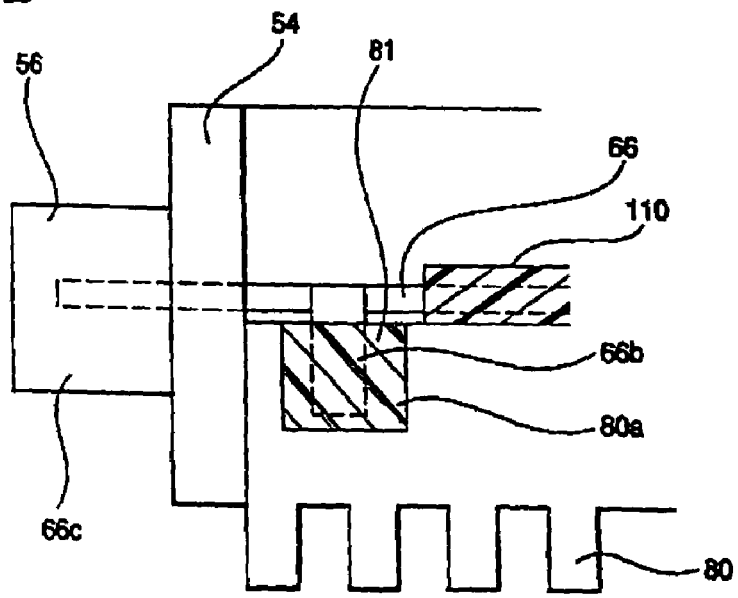

FIGS. 10A and 10B show another embodiment of the present invention. FIG. 10A is a top view showing a portion near to a connector portion of the power connector-incorporating casing 54, and FIG. 10B is a view of the power connector-incorporating casing 54 seen from a lateral side. In this embodiment, a recess 80a is formed in the heatsink 80. The bus bars 66 and 68 pass above the recess 80a, and are connected into the connector 56 through the power connector-incorporating casing 54 and exposed in the connector 56. The exposed bus bars respectively form connector pins 66c and 68c to be connected with an exterior. The recess 80a is filled and sealed with an electrically-insulative resin 81. Accordingly, the heat sink 80 and the bus bars 66 and 68 are insulated from each other. It is preferable for the electrically-insulative resin 81 to use an electrically-insulative resin 81 having high thermal conductivity such as an epoxy resin, a silicon resin, etc. Additionally, the bus bars 66 and 68 above the recess 80a may be covered with the electrically-insulative resin 81.

Above the recess 80a, branches 66a and 68a are formed which branch off from the bus bars 66 and 68 respectively in a side direction of the bus bars 66 and 68. The branches 66a and 68a are bent at a bent portion 66b and 68b in a lower direction, and elongate in a direction of the bottom surface of the recess 80a. Spaces between the branches 66a and 68a and the bottom surface of the recess 80a are also filled with the electrically-insulative resin 81, so that the heatsink 80 and the branches 66a and 68a are insulated from each other. In case that the bus bars 66 and 68 above the recess 80a are covered and sealed with the electrically-insulative resin 81, the branches 66a and 68a are also covered and sealed therewith.

The heat radiation according to this embodiment will be described below. Heat generated near to the connector pins 66c and 68c is conducted to the electrically-insulative resin 81 through the branches 66a and 68a of the bus bars 66 and 68. After that, the heat is conducted from the electrically-insulative resin 81 to the heatsink 80, and radiated from a lower surface of the heatsink 80 to outside. According to this embodiment, because the recess 80a is formed in the heatsink 80, a surface area of the heatsink 80 increases on a side facing the bus bars 66 and 68, thereby improving the thermal conduction efficiency from the electrically-insulative resin 81 to the heatsink 80. Moreover, because the branches 66a and 68a of the bus bars 66 and 68 are formed, a total surface area of the bus bars 66 and 68 is larger than that of the bus bars without the branches 66a and 68a, thereby improving the thermal conduction efficiency from the bus bars 66 and 68 to the electrically-insulative resin 81. Moreover, because the branches 66a and 68a elongate into the recess 80a, the heat sink 80 and the bus bars 66 and 68 can be kept closely in distance, whereby the heat can be conducted quickly from the branches 66a and 68a to the heatsink 80.

As mentioned above, according to the embodiment shown in FIGS. 10A and 10B, the branches are respectively formed to branch from the bus bars above the recess formed in the heatsink, The branches elongate in the direction of the bottom surface of the recess. Then, the recess is filled and sealed with the electrically-insulative resin. Therefore, the heat radiation efficiency from a heat-generating portion to the heatsink can be improved. Accordingly, even if the large current flowing in the bus bars rises a temperature of the connector pins, the temperature rise at the connector pins can be suppressed, and heat conduction to the control circuit portion can be suppressed.

In this embodiment, the branches 66a and 68a are formed in the side direction of the bus bars 66 and 68. However, the shape of the branches is not limited to this method, but all modes for elongating the bus bars into the recess 80a can be allowed and included in the present invention. For example, branches may be connected and fitted under the bus bars 66 and 68 so as to elongate the branches into the recess.

Figure 11A:
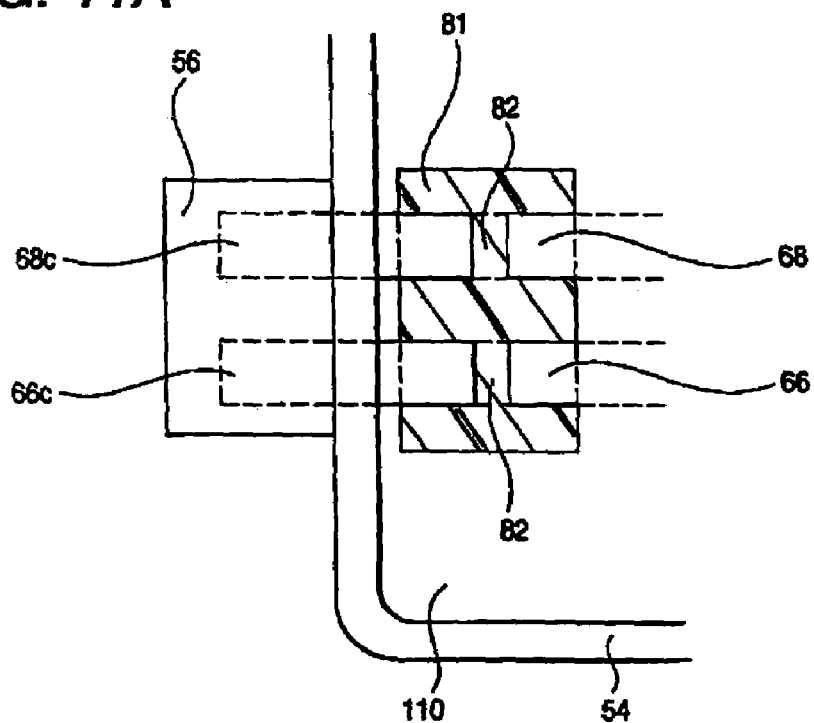
Figure 11B:
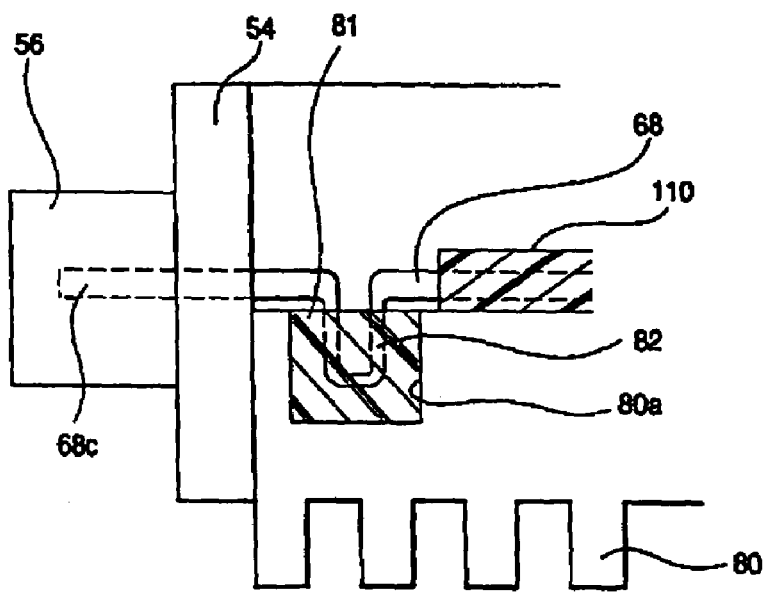

FIGS. 11A and 11B show another embodiment of the present invention. FIG. 11A is a top view showing a portion near to the connector portion 56, and FIG. 11B is a view of the power connector-incorporating casing 54 seen from a lateral side. The same parts as those of FIGS. 10A and 10B are omitted by indicating them by using the same reference numerals. In this embodiment, folded back portions 82 are formed in the bus bars 66 and 68 in stead of the branches 66a and 68a. Specifically, the bus bars 66 and 68 are bent from a position above the recess toward the bottom surface of the recess 80a. Then, the bus bars are upwardly folded back near to the bottom surface of the recess 80a, and bent in the horizontal direction at the position above the recess 80a. The recess 80a is filled with the electrically-insulative resin 81 so that the heatsink 80 and the bus bars 66 and 68 are insulated from each other. According to this embodiment, the bus bars 66 and 68 exist into the recess 80a. Therefore, the same effect can be achieved as those of the embodiment shown in FIGS. 10A and 10B.

Figure 12A:
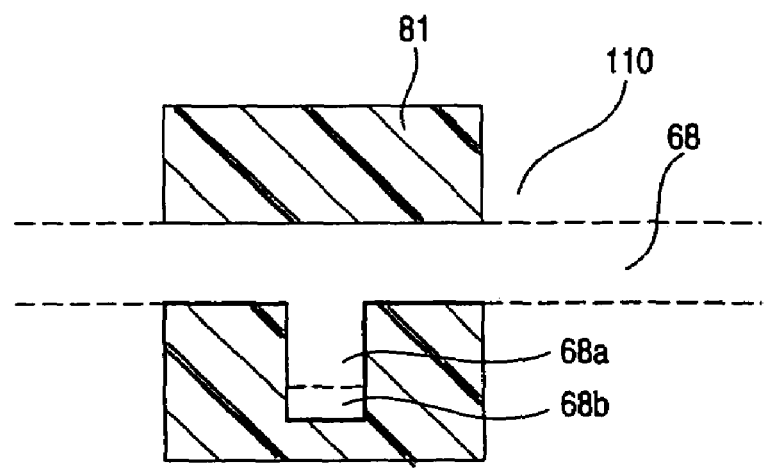
Figure 12B:
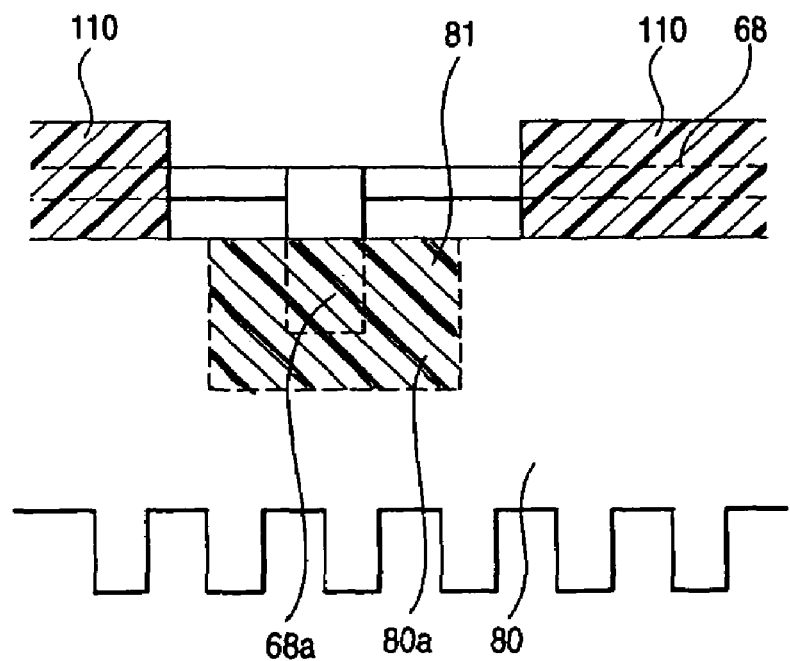

In the embodiments shown in FIGS. 10A, 10B, 11A and 11B, near to the connector portion 56, the recess 80a is formed in the heatsink 80a, and the branches 66a and 68a or the folded back portions 82 are formed and inserted into the recess 80a. However, the place where the recess 80a is formed is not limited near to the connector portion 56, but the recess 80a maybe formed at every place where large heat is to be generated. In such a case, as well as the aforementioned embodiments, the bus bars may elongate into the recess 80a, which may be filled with the electrically-insulative resin, in order to improve the heat conduction efficiency. One example thereof is shown in FIGS. 12A and 12B. FIG. 12A is a top view of a portion where the recess 80a is formed in the heat sink 80 in the power connector-incorporating casing 54. FIG. 12B is a view of the power connector-incorporating case seen from a lateral side. In the FIGS. 12A and 12B, although a place where the recess 80a is formed is different from those of the embodiments mentioned above, the structure and the effects thereof are the same as those of the embodiments as shown in FIGS. 10A, 10B, 11A and 11B. In general, at the connection portion between the bus bar and the connection terminal, a contact resistance exists and the heat is generated at the connection portion. Therefore, near to the connection portion, when the recess 80a is formed, the bus bar 68 elongates into the recess 80a, and the recess 80a is filled with the electrically-insulative resin 81, the heat generated at the connection portion can be conducted quickly to the heatsink 80, thereby radiating the heat to the outside through the heatsink 80.

Next, FIGS. 13A and 13B show another embodiment of the present invention. FIG. 13A is a top view showing a portion near to the connector portion 56, and FIG. 13B is a view near to the connector portion 56 seen from a direction indicated by an arrow D of FIG. 13A. In this embodiment, the bus bars 66 and 68 branch off in front of the connector portion 56 to right and left directions, respectively. A groove 69 is formed in an inner side surface of the power connector-incorporating casing 54 in the horizontal direction. The branched bus bars 66e and 68e is disposed in the groove 69 along with the groove 69 formed in the side surface of the power connector-incorporating casing 54.

The heat radiation according to this embodiment will be described below. Heat generated at the connector pins 66c and 68c is conducted to the bus bars 66e and 68e in the inner side surface of the power connector-incorporating casing 54 through branches 66d and 68d. The heat conducted to the bus bars 66e and 68e are radiated inside the power connector-incorporating casing 54. Each of the bus bar 66e and 68e operates as a radiating fin. Therefore, the heat of the connector pins 66c and 68c is conducted to the bus bars 66e and 68e of the inner side surface of the power connector-incorporating casing 54, from which the heat is radiated inside the power connector-incorporating casing 54. Therefore, according to this embodiment, the heat generated locally is quickly conducted to the peripheral portions through the bus bars, thereby preventing the heat from remaining locally and the temperature at that place from raising.

Figure 14A:
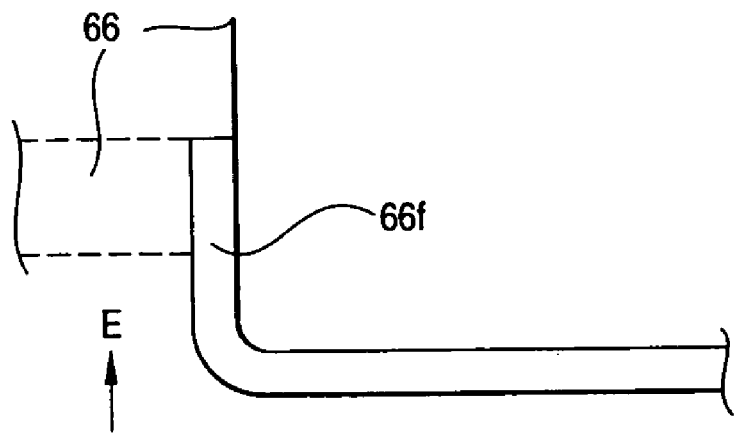
Figure 14B:
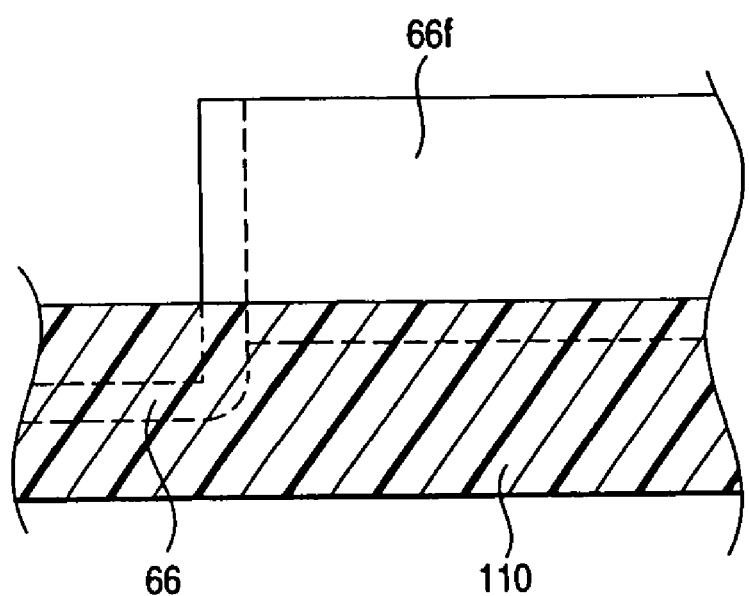
Figure 15:
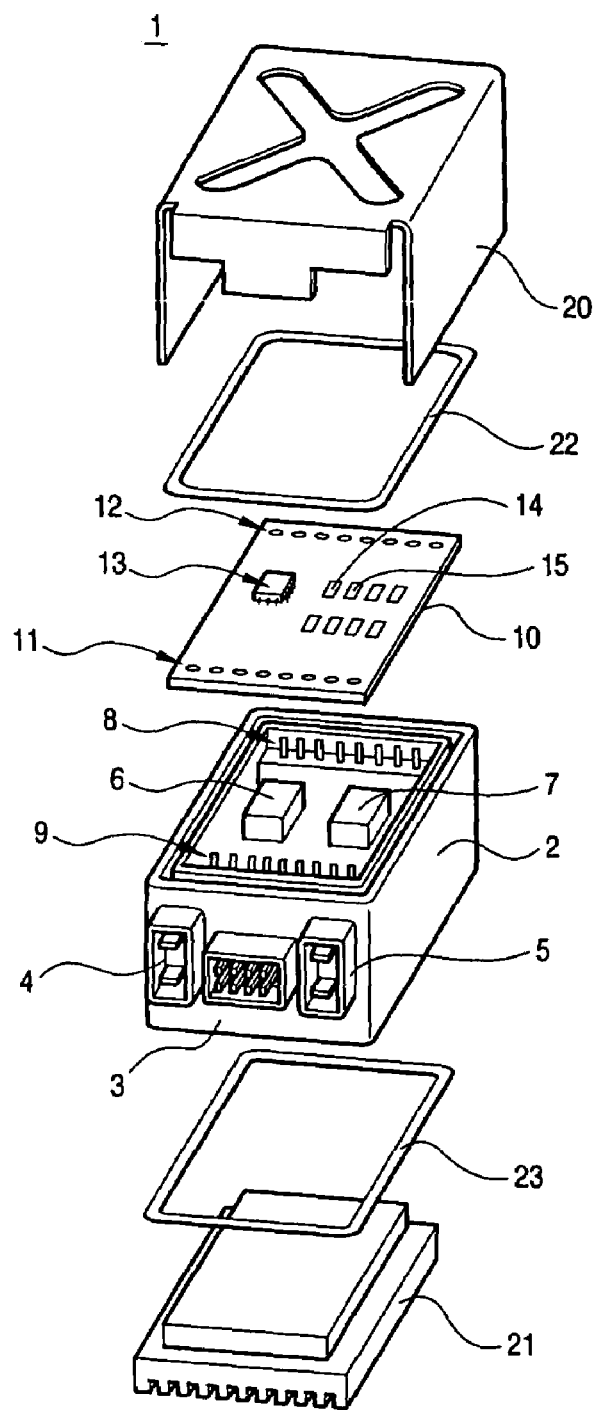
FIG. 15 is an exploded, perspective view of a combination structure of a conventional electronic control unit 1.

Next, FIGS. 14A and 14B show another embodiment of the present invention. FIG. 14A is a view of a part of the bus bar 66 disposed in the power connector-incorporating casing 54 as seen from a top side. FIG. 14B is a view seen from a direction indicated by an arrow E of FIG. 14A. The bus bar 66 is a path for transmitting an electric power supplied through the connector portion 56 to the power parts 57 and 58, etc., which is embedded in the synthetic resin 110 in the power connector-incorporating casing 54. In this embodiment, as shown in FIGS. 14A and 14B, a part of the bus bar 66 being an exposed portion 66f is exposed from the synthetic resin 110 in a hollow portion in the power connector-incorporating casing 54, and the exposed portion 66f is integrally formed with the bus bar 66. In this manner, because the exposed portion 66f is integrally formed with the bus bar 66, the exposed portion 66f operates as a radiating fin, so that the heat inside the bus bar 66 can be quickly radiated inside the power connector-incorporating casing 54. Accordingly, the bus bar 66 may be exposed to form the exposed portion 66f from the synthetic resin near to every place where the large heat is to be generated, thereby preventing the temperature at that place from rising.

Additionally, if it is expected that temperature may rise extremely at a portion, combining one heat radiation structure with one or more of the other heat radiation structures as mentioned in the aforementioned embodiments, heat can be radiated and the rising of temperature at a specific place can be suppressed more effectively. For example, the heat radiation structure can be formed in such a manner that the recess is formed in the heatsink, the bus bar elongates into the recess, and then the recess is filled with the electrically-insulative resin, as well as the bus bar is exposed from the inside of the synthetic resin to operate as the radiating fin, whereby the heat can be radiated more effectively.

In the electronic control unit 31 of FIG. 1, although the intermediate layer 51 is interposed between the control portion 32 and the power portion 33, the provision of the intermediate layer 51 can be omitted by adopting a construction in which the connection terminals 59 of the power portion 33 are so arranged as to be connected directly to the respective relay connection terminals 39 of the control portion 32. The control portion connection terminals 52 and the power portion connection terminals 53 are formed integrally on the intermediate layer 51, and in addition parts, such as a drive circuit, can be provided on the intermediate layer 51. When such parts are arranged on the intermediate layer 51, the space within the electronic control unit 31 can be utilized more efficiently, and the parts can be mounted or packaged with high density. The relay connection terminals 39 may not be provided at the control connector-incorporating casing 34, in which case the control portion connection terminals 52 on the intermediate layer 51 or the connection terminals 59 on the power portion 33 can be connected directly to the connection terminals 42 on the control board 40. The connection of each terminal is effected directly from the part to be connected or through the terminal provided upright in the vicinity of this part, and therefore the amount of extending of the conductor patterns in the control connector-incorporating casing 34, the intermediate layer 51 and the power connector-incorporating casing 54 can be reduced, and the connecting distance therebetween can be reduced, so that adverse effects of noises can be reduced.

As described above, in the present invention, the control portion and the power portion, which are separate from each other, are combined together, and therefore as compared with an integral construction, the control portion is less affected by heat from the power portion, and is less affected by noises, so that the stable operation can be effected. The plurality of control parts are provided within the control casing of the control portion, and the plurality of control-side terminals, electrically connected to the respective control parts, are provided upright in a concentrated manner at the predetermined portion, and the hollow portion is provided within the control casing. The plurality of power parts are provided within the power casing of the power portion, and the plurality of power-side terminals, electrically connected to the respective power parts, are provided upright in a concentrated manner at the predetermined portion. When the control portion and the power portion are combined together, the plurality of power-side terminals extend into the hollow portion of the control portion, and can contact the plurality of control-side terminals, respectively. With this construction, merely by stacking the control portion and power portion together, the electronic equipment can be assembled, and the electrical connection can be effected simultaneously with this assembling operation.

In the invention, the internal space of the control casing is divided into the first hollow portion and the second hollow portion by the wall, and the electrical connection to the power side is effected in the first hollow portion, and the control board, on which the plurality of connection terminals, electrically connected to the plurality of control parts, are provided upright, is received within the second hollow portion. When the control board is received within the second hollow portion, the plurality of connection terminals, provided upright on the control board, are connected to one ends of the plurality of relay connection terminals, respectively. When the control portion is stacked on the power portion, the plurality of power-side terminals extend into the first hollow portion, and are connected to the other ends of the relay connection terminals, respectively. Even if the connection terminals are randomly provided upright in accordance with the arrangement of the control parts on the control board, the connection terminals can be connected to the relay connection terminals in a concentrated manner, and the electrical connection can be easily effected when the control portion and the power portion are combined together.

In the invention, the intermediate layer can be mounted on the power portion on which the plurality of connection terminals, electrically connected to the plurality of power parts, are provided upright. Even if the connection terminals are randomly provided upright in accordance with the arrangement of the power parts within the power casing, these connection terminals can be contacted with the power portion connection terminals at the intermediate layer, and can be connected to the power-side terminals in a concentrated manner in the intermediate layer. Therefore, the electrical connection can be easily effected when the control portion and the power portion are combined together.

In the invention, the joining of the terminals of the power parts to the respective bus bars at the power portion and the electrical connection between the control portion and the power portion can be easily effected separately from each other.

In the invention, the electrical connection between the plurality of power-side terminals and the plurality of control-side terminals, the electrical connection between the plurality of connection terminals, provided upright at the power portion, and the plurality of power portion connection terminals, and the electrical connection between the terminals of the power parts and the bus bars can be effected easily and positively by resistance welding at the time of assembling the power portion. Also, the electrical connection between the plurality of connection terminals, provided upright on the control board, and one ends of the plurality of relay connection terminals, can be effected easily and positively by resistance welding at the time of assembling the power portion. Furthermore, the electrical connection between the plurality of power-side terminals and the other ends of the plurality of relay connection terminals can be effected easily and positively by resistance welding at the time of combining the control portion and the power portion.

In the invention, those portions of the power portion and the control portion to be combined together are joined together by ultrasonic welding or vibration welding, and the waterproof effect and the joining can both be effected without the use of a packing or the like.

In the invention, the control board is sealed in the resin layer formed by resin potting, and therefore, the electrical connection portions in the control board are prevented from being exposed, thereby enhancing the reliability.

In the invention, the parts are also mounted on the intermediate layer, and therefore the degree of freedom of arrangement of the parts in the power portion can be increased. For example, when a drive circuit for driving a power control element at the power portion in response to a signal from the control portion is provided on the intermediate layer, signals in the electronic equipment flow generally from the control portion to the power portion, so that the reliability can be enhanced.

In the invention, heat is efficiently radiated from the power portion by the use of the heatsink having the recess for receiving the terminals of the power parts and the bus bars, and by doing so, adverse effects of the heat on the electronic equipment can be reduced. The resin is filled in the recess by resin potting, so that the terminals of the power parts and the bus bars are sealed in the resin, and therefore, the reliability of the connection portions can be enhanced.

In the invention, heat is effectively radiated from the outside by elongating a part of the bus bar into the recess formed in the heatsink, and filling the recess with the electrically-insulative resin, thereby reducing adverse effects of the heat to the electronic equipments.

In the invention, a portion operating as a radiating fin is integrally formed with the bus bar, so that heat generated at a portion connected to the bus bar is quickly radiated to the outside of the bus bar, thereby suppressing temperature at the connection portion from rising.

What is claimed is:

1. An electronic equipment comprising:
   a casing;
   a synthetic resin layer formed in the casing; and
   a bus bar extending in parallel to a top surface of the synthetic resin layer; wherein:
   a part of the bus bar extending in parallel to the top surface of the synthetic resin layer is embedded in the synthetic resin layer in the casing; and
   the top surface of the synthetic resin layer defines a boundary between the part of the bus bar embedded and another part of the bus bar exposed to a space in the casing.

2. The electronic equipment according to claim 1, wherein the part of the bus bar radiates heat to the space in the casing.

* * * * *